United States Patent [19]

Wilde

[11] 4,243,958
[45] Jan. 6, 1981

[54] PHASE-MULTIPLEXED CCD TRANSVERSAL FILTER

[75] Inventor: Doran K. Wilde, Aloha, Oreg.

[73] Assignee: Tektronix, Inc., Beaverton, Oreg.

[21] Appl. No.: 33,361

[22] Filed: Apr. 26, 1979

[51] Int. Cl.³ .................... H03H 15/02; G11C 19/28; G11C 27/00
[52] U.S. Cl. .............................. 333/165; 307/221 D; 333/166
[58] Field of Search .............. 333/165, 166, 167, 173, 333/174, 178; 307/221 D, 295, 304, 221 R, 221 C; 328/167; 364/824–827, 862

[56] References Cited

U.S. PATENT DOCUMENTS

| 4,031,490 | 6/1977 | Copeland | 307/221 D |
| 4,123,733 | 10/1978 | Poirier | 357/24 |
| 4,145,676 | 3/1979 | Benoit-Gonin et al. | 307/221 D |

Primary Examiner—Marvin L. Nussbaum
Attorney, Agent, or Firm—George T. Noe

[57] ABSTRACT

A phase multiplexed CCD transversal filter includes N substantially identical parallel-connected CCD's which acquire samples in a predetermined consecutive order over a given clock cycle so that the apparent sampling frequency is equal to N times the clock frequency. The output taps of the CCD's are weighted in a predetermined manner to provide a filter having a predetermined transfer function.

1 Claim, 3 Drawing Figures

PHASE-MULTIPLEXED CCD TRANSVERSAL FILTER

BACKGROUND OF THE INVENTION

Charge transfer transversal filters are well known in the art and are utilized in a variety of digital filtering applications. These devices are essentially discrete time sampled tapped analog delay lines. Predetermined mathematic weighting coefficients are assigned to each tap to provide a filter having predetermined characteristics with a finite impulse response. Node voltages which correspond to each tap are non-destructively sensed and combined with the weighting coefficients, then these voltages are summed to provide an output voltage. Each time the analog voltages are moved under clock control to a new tapped position, an output voltage is again computed, producing an output signal which is dependent upon the transfer function of the filter.

In a charge-coupled device (CCD), an input signal is iteratively sampled at a predetermined frequency $f_s$. Charge packets proportional to the amplitude values of the samples are formed in a potential well in a semiconductor material adjacent to a sampling gate, and these charge packets are moved from well to well along the CCD channel under the control of clock pulses which occur at a frequency $f_c$. Before a new sample can be taken each time, the first potential well must be cleared of the charge packet corresponding to the previous sample. Thus, the clock frequency $f_c$ becomes a limiting factor for both sampling rate and operating speed of a single channel CCD. Correspondingly, since the minimum sampling rate, or Nyquist sampling rate, must be at least twice the frequency of the input signal, the frequency of the input signal is also limited.

SUMMARY OF THE INVENTION

In accordance with the present invention, a phase-multiplexed CCD transversal filter is provided in which the sampling rate is greater than the clock frequency, extending the frequency range over which the filter can be operated for a given CCD structure and clock frequency.

For $f_s = Nf_c$, where N represents the multiple of the clock frequency $f_c$ by which the sampling frequency $f_s$ is to exceed the clock frequency, the phase-multiplexed CCD transversal filter comprises N substantially identical CCD's. An N-phase sampling clock is provided to cause each CCD to sample an input signal in sequence. All of the output taps of all of the CCD devices in the filter are weighted and summed; however, the weighting coefficients are distributed among the taps of the CCD's in the order which samples are taken so as to effect the transfer function of the filter. For N CCD's each having M taps, M times N weighting coefficients are required. A CCD transversal filter, the sampling rate of which is higher than the clock rate, is particularly useful as a prefilter.

It is therefore one object of the present invention to provide a phase-multiplexed CCD transversal filter.

It is another object to provide a CCD transversal filter for which the sampling frequency $f_s$ is equal to N times the clock frequency $f_c$.

Other objects and advantages will become apparent to those having ordinary skill in the art upon a reading of the following description when taken in conjunction with the accompanying drawings.

DETAILED DESCRIPTION OF THE INVENTION

Figure 1:
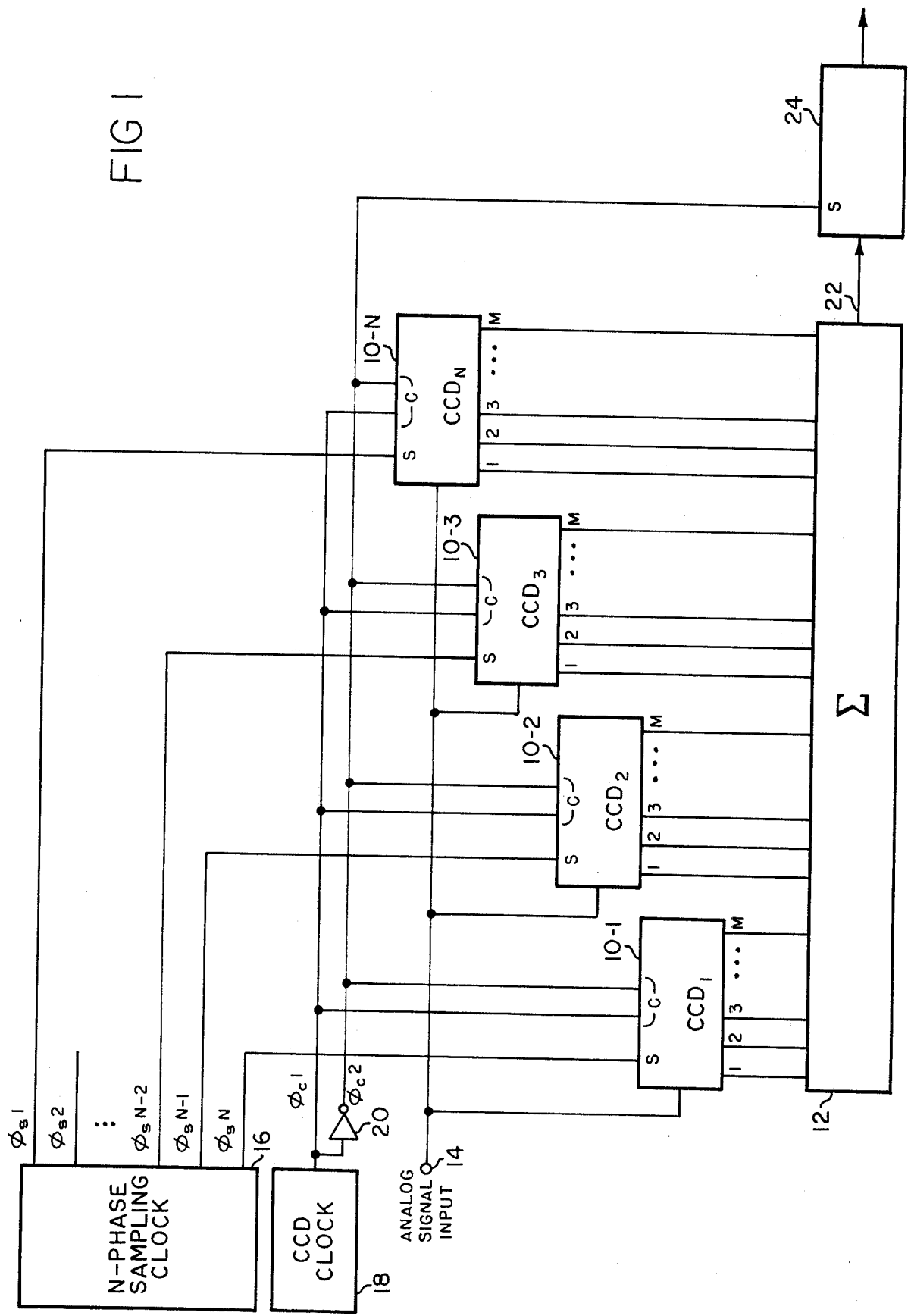
FIG. 1 shows a block diagram of a phase-multiplexed CCD transversal filter in accordance with the present invention.

Turning now to the drawings, there is shown in FIG. 1 a block diagram of a phase-multiplexed CCD transversal filter which may be operated as a prefilter to eliminate the frequency response aliasing which occurs around the sample frequency of a subsequent transversal filter running at the same elementrate as the prefilter. It is well known that such prefilters must presample several times per one output sample, and for this prefilter the sampling frequency $f_s$ is equal to N times the CCD clock frequency $f_c$. The filter comprises N CCD's designated 10-1 through 10-N, each of which has M taps connected to a summing device 12. These CCD's are conventional devices in which an analog signal is iteratively sampled, and charge packets proportional to the instantaneous amplitude values of the input signal are formed in a potential well in a semiconductor material adjacent to a sampling gate. The charge packets are moved from position to position along the CCD channel under the control of clock pulses. At each position, the charge packets are non-destructively sensed and combined with tap weights which are predetermined in accordance with the characteristics of a particular filter. The sensing and weighting operating may be accomplished by the use of any of a number of well-known standard techniques, including the use of split electrodes or analog amplifiers or multipliers.

Figure 2:
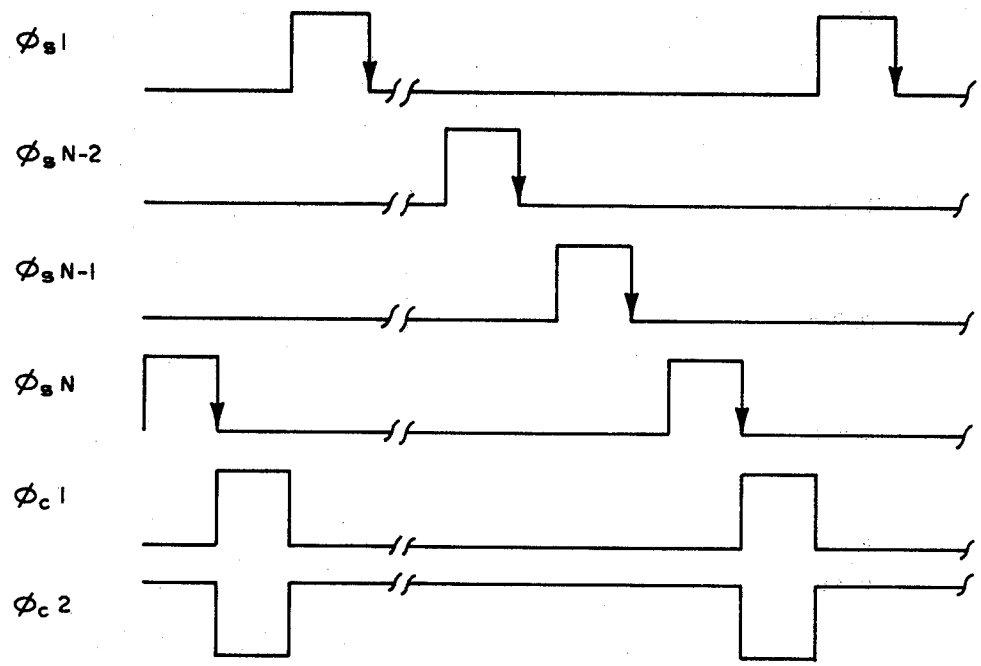
FIG. 2 is a timing diagram for explaining the operation of the block diagram of FIG. 1.

An analog signal is applied via an input terminal 14 to all of the CCD's. An N-phase sampling clock 16 provides a multiphase sampling signal, the different phases of which are applied to the sampling inputs (s) of the CCD's. A CCD clock 18 together with inverter 20 provides a two-phase clock signal which is applied to the clock inputs (c) of the CCD's to move the charge packets from position to position along the CCD channel. This can best be understood by reference to the timing diagram of FIG. 2. The signals designated $\phi_s$ are the sampling clock pulses, while the signals designated $\phi_c$ are the CCD clock signals. N samples are taken for each CCD clock cycle, with the oldest sample being stored in CCD 10-N and the newest sample being stored in CCD 10-1. The sampling gate is opened on the rising edge of the sample clock, allowing the input to follow the input signal. The sampling gate is closed on the negative edge, signified by the arrow, and the instantaneous voltage value of the input signal is latched into the potential well. After all of the CCD's have acquired a sample, the CCD clock shifts all of the charge packets in all of the CCD's to the next tap position and clears the sampling gates so that new samples may be taken.

The CCD's appear to the summing device 12 as a single CCD having a length N X M. For example, four CCD's each having length of 32 taps appear to be a single CCD having a length of 128 tap positions. Tap weights are determined in accordance with the transfer function of the filter and are distributed to the M taps of the N CCD's in the order in which they are sampled so that the correct weighting coefficient will correspond to each tap in the proper time sequence. The summed output from summing device 12 is made available on output line 22 and may be applied to the first stage of an actual filter represented by CCD 24. The sampling gate of CCD 24 is activated by clock signal $\phi_{c2}$, which is closed on the negative edge to latch the instantaneous value of the summed output from the prefilter.

Figure 3:
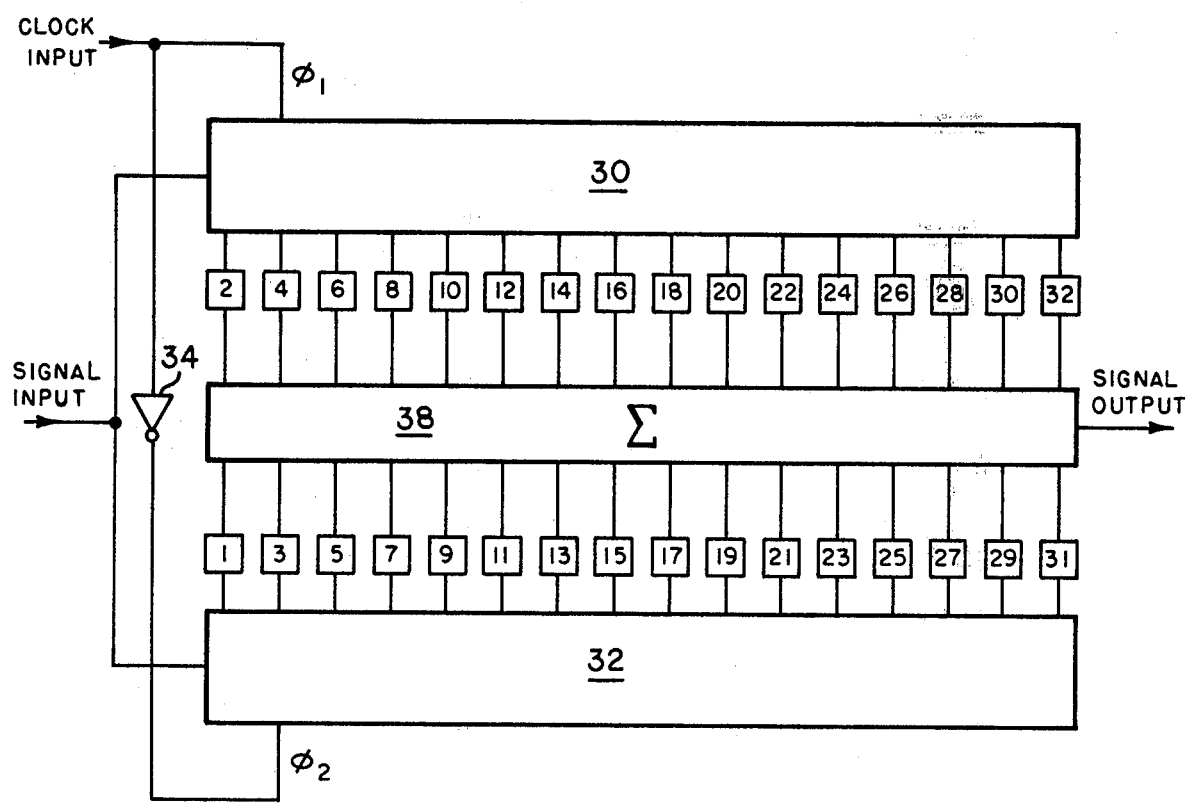
FIG. 3 is a schematic diagram of a phase-multiplexed CCD transversal filter in which the sampling frequency is twice the CCD clock frequency.

A time multiplexed CCD transversal filter for which N=2 is shown in FIG. 3. Here an input signal is applied simultaneously to a pair of substantially identical CCD's 30 and 32. A symmetrical clock input is split into two phases $\phi_1$ and $\phi_2$ by an inverter 34, clock signals $\phi_1$ and $\phi_2$ being 180 degrees apart. It should be understood that clock signals $\phi_1$ and $\phi_2$ may be further split into as many phases as are required by the type of CCD's used in order to move charge packets along the channels. For example, some CCD's may require a 3-phase or a 4-phase clock; however, this aspect of the clocking is not germane to this description, and $\phi_1$ and $\phi_2$ are each described as single-phase clock signals to maintain simplicity of this discussion. Furthermore, it may be assumed that sampling of the input signal is coincident with the clocking of the CCD's.

The CCD's 30 and 32 are shown with each having 16 taps so that overall a 32-tap transversal filter is provided. The assignment of tap weights is illustrated by boxes containing a tap number connected to each CCD tap. Note that CCD 30 is assigned the even-numbered taps while CCD 32 is assigned the odd-numbered taps. The actual sensing and weighting of the charge packets in the CCD channels may be accomplished by the use of conventional split electrode techniques or by the use of analog multipliers or amplifiers. The weighted taps are connected to a summing device 38, which may be any conventional summing device, depending upon whether the tapped and weighted CCD outputs are current or voltage signals.

In operation, CCD 30 takes a sample of the input signal when activated by clocks signal $\phi_1$, and all of the charge packets within the CCD are shifted one position along the channel. Then, half a clock cycle later, CCD 32 takes a sample of the input signal when activated by clock signal $\phi_2$, and all of the charge packets within the CCD are shifted one position along the channel. The weighted taps of both CCD's 30 and 32 are summed and made available as an output signal. It should be pointed out that the output signal is invalid for the half cycle prior to CCD 32 taking its sample; however, this is of no consequence since it is easy to ascertain that any following circuits sample the output signal during the valid half cycle.

While the invention has been particularly shown and described with reference to the embodiments thereof, it will be understood by those skilled in the art that the foregoing and other changes in form and detail may be made without departing from the spirit and scope of the invention.

What I claim as being novel is:

1. A phase-multiplexed CCD transversal filter, comprising:

a multi-phase sampling clock source for producing a plurality of sampling clock signals having a predetermined frequency and different predetermined phases of a single clock cycle;

a plurality of charge coupled devices defining serially arranged delay elements, each of said charge coupled devices receiving a different sampling clock signal so that said charge coupled devices acquire samples of an input signal in a predetermined consecutive order;

means for sensing the value of the charge stored in said serially arranged delay elements and combining predetermined weighting coefficients therewith; and means for summing said sensed and weighted values to provide an output signal which is related to the input signal in accordance with a predetermined transfer function, wherein said plurality of charge coupled devices consists of N CCD's connected in parallel, said multiphase sampling clock source produces N clock signals having the same frequency $f_c$ so that the apparent sampling frequency $f_s = Nf_c$, and each CCD has M taps so that said filter appears to comprise a single CCD having a length of N times M elements.

* * * * *